(12) United States Patent
Ratificar et al.

(10) Patent No.: US 6,644,536 B2
(45) Date of Patent: Nov. 11, 2003

(54) SOLDER REFLOW WITH MICROWAVE ENERGY

(75) Inventors: Glenn Ratificar, Gilbert, AZ (US);
Carlos Gonzalez, Chandler, AZ (US);
Lejun Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/041,012

(22) Filed: Dec. 28, 2001

(65) Prior Publication Data

US 2003/0121958 A1 Jul. 3, 2003

(51) Int. Cl.[7] .................. B23K 3/02; B23K 31/00; H05B 6/64
(52) U.S. Cl. .................. 228/234.1; 228/180.21; 228/180.22; 228/246; 219/678
(58) Field of Search ................. 278/234.1, 1.1, 278/246, 180.21, 180.22; 219/678

(56) References Cited

U.S. PATENT DOCUMENTS

| | | | |
|---|---|---|---|
| 4,767,902 A | * 8/1988 | Palaith et al. ............... 219/706 |
| 5,058,800 A | 10/1991 | Yoshizawa et al. ..... 228/180.21 |
| 5,172,852 A | * 12/1992 | Bernardoni et al. ... 228/180.21 |
| 5,261,593 A | * 11/1993 | Casson et al. ......... 228/180.22 |
| 5,586,714 A | * 12/1996 | Curicuta et al. ......... 228/122.1 |
| 5,984,165 A | * 11/1999 | Inoue et al. ........... 228/180.22 |
| 6,054,693 A | * 4/2000 | Barmatz et al. ............. 219/678 |
| 6,153,940 A | * 11/2000 | Zakel et al. ................. 257/779 |
| 6,204,490 B1 | * 3/2001 | Soga et al. ................. 219/678 |
| 6,312,548 B1 | * 11/2001 | Fathi et al. ............... 156/275.1 |
| 6,329,608 B1 | * 12/2001 | Rinne et al. ................. 174/261 |
| 6,372,622 B1 | * 4/2002 | Tan et al. ................... 438/612 |
| 2003/0019917 A1 | * 1/2003 | Furuno et al. .............. 228/246 |

FOREIGN PATENT DOCUMENTS

| GB | 2376201 A | * 12/2002 |
| JP | 57-132334 A | * 8/1982 |
| RU | 285001 A | * 1/1988 |

* cited by examiner

Primary Examiner—M. Alexandra Elve
Assistant Examiner—L. Edmondson
(74) Attorney, Agent, or Firm—George Chen

(57) ABSTRACT

The present invention includes a mechanical joint between a die and a substrate that is reflowed by microwave energy and a method of forming such a mechanical joint by printing a solder over a substrate, placing the solder in contact with a bump over a die, reflowing the solder with microwave energy, and forming a mechanical joint from the solder and the bump.

13 Claims, 2 Drawing Sheets

US 6,644,536 B2

SOLDER REFLOW WITH MICROWAVE ENERGY

BACKGROUND OF THE INVENTION

1. Field of the Invention

The present invention relates to the field of semiconductor integrated circuit (IC) manufacturing, and more specifically, to a method of packaging flip chips.

2. Discussion of Related Art

Chip-to-package interconnections have traditionally involved wirebonding. Wirebonding is the use of very fine metal wires to join the contacts at the top surface of the chip with the corresponding contacts at the top surface of the substrate. However, as transistor sizes continue to shrink, chip performance and chip reliability are becoming limited by the chip-to-package interconnections. Consequently, wirebonding is being superseded by solder bumping.

Solder bumping has many advantages over wirebonding. First, bumps may be placed anywhere over the chip so the input/output (I/O) density is significantly increased. Second, the bumps reduce the length of the interconnections so chip performance is greatly enhanced. Third, eliminating the edge-connections associated with wirebonding allows a higher level of integration of the chip with the packaging, thus decreasing the footprint of the package.

As part of the process of solder bumping, a chip on a die is attached to a substrate in a package by reflowing solder in a convection oven. Reflow involves melting the solder to reach an energetically more favorable shape and state. However, all components on the die and the substrate are heated so damage may result, especially during cool down, from the large stresses that arise at interfaces between different materials. Such thermal mismatch occurs because the Coefficient of Thermal Expansion (CTE) of the substrate may be about ten times larger than the CTE of the chip. The difference in CTE with the chip is larger for organic substrates than for ceramic substrates. The large stresses may lead to delamination and cracks which tend to propagate when the chip is thermally loaded, especially under conditions of high humidity.

Thus, what is needed is a method of selectively reflowing solder without affecting other components on the substrate.

DETAILED DESCRIPTION OF THE PRESENT INVENTION

In the following description, numerous particular details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention comprises a mechanical joint between a substrate and a die and a method of using microwave energy to form the mechanical joint. Microwave energy may be used to selectively reflow solder on the substrate to form the mechanical joint with input/output (I/O) connections at the surface of the die or flip chip. The mechanical joint in Surface Mount Technology (SMT) allows an electrical connection for power, ground, or signal in and out of the die.

In one embodiment, the substrate may be an interposer in a flip-chip Chip Scale Package (CSP) or a Ball Grid Array (BGA). In another embodiment, the substrate may be a printed circuit board (PCB) in Direct Chip Attach (DCA). The substrate may be ceramic, organic, or a composite. Examples include Alumina, FR-4, and resin. The die may be an active or passive electronic component. Examples include Integrated Circuits (IC) chips, such as a microprocessor or a memory chip. Other examples include surface mount components, such as capacitors and resistors. The die may include dielectric, semiconducting, and metallic materials.

Figure 1A:
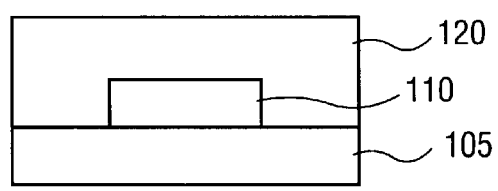
FIGS. 1(a)–(e) is an illustration of an elevation view of an embodiment of a method of reflowing solder according to the present invention.

Various embodiments of the method of the present invention will be described next. A die 100 has an electronic component 105 that may be active or passive. An embodiment is shown in FIG. 1(a). In one embodiment, the electronic component 105 is a microprocessor having devices connected with a multilevel interconnect system. The multilevel interconnect system may include a stack of 2–7 layers of conducting lines connected vertically with conducting plugs. The conducting lines are electrically isolated, vertically and laterally, with dielectric material. The conducting lines may be Aluminum or Copper. The conducting plugs may be Tungsten or Copper. The dielectric material may be Silicon Oxide, Silicon Nitride, or Silicon Oxynitride. Other material may be included, such as adhesion layers, diffusion barrier layers, anti-reflective coating (ARC) layers, and capping layers.

An input/output (I/O) connection, such as a bond pad 110, is located on the surface of the electronic component 105 and covered with a passivation layer 120. An embodiment is shown in FIG. 1(a). The bond pad 110 may be Aluminum. In one embodiment, the passivation layer is a photoimageable polyimide 120 that is spin-coated.

Figure 1B:
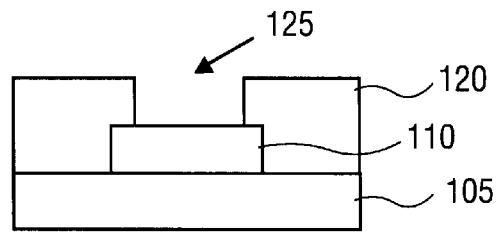

The polyimide 120 is exposed and developed to open a via 125 over the bond pad 110. An embodiment is shown in FIG. 1(b). The polyimide 120 is a thermoplastic polymer that, after curing, has very good properties with respect to thermal stability (over 400 degrees Centigrade), mechanical toughness (high tensile strength and high elastic modulus), dielectric constant, and chemical resistance.

Figure 1C:
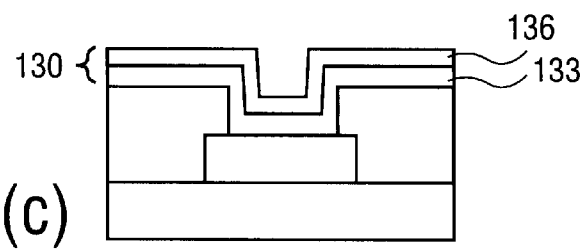

After plasma pre-clean to remove oxide from the surface of the bond pad 110, an Under Bump Metallurgy (UBM) 130 base structure is sputtered over the polyimide 120 and the portion of the bond pad 110 uncovered by the via 125. An embodiment is shown in FIG. 1(c). The UBM 130 may include several layers, such as a lower layer 133 and an upper layer 136.

The lower layer 133 may be formed from Titanium with a thickness of about 200–1500 Angstroms. Other possible materials for the lower layer 133 include Titanium-Tungsten, Tantalum, or Chromium. The lower layer 133 provides good adhesion to the bond pad 110 and the polyimide 120 to protect the multilevel interconnect system below the bond pad 110 from corrosion.

The upper layer 136 may be formed from Nickel-Vanadium with a thickness of about 1000–8000 Angstroms. Other possible materials for the upper layer 136 of the UBM 130 include Nickel, Copper, Gold, Nickel-Gold, or Copper-Gold. The upper layer 136 provides good adhesion to the lower layer 133 and is wettable by solder 150. The upper layer 136 also acts as a diffusion barrier to prevent interdiffusion of metals between the solder 150 and the bond pad 110 that may result in embrittlement, higher resistivity, and premature structural failure.

Figure 1D:
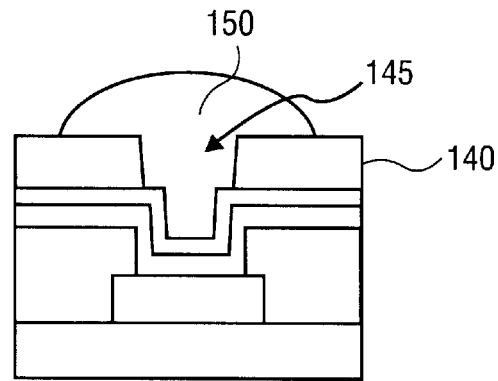

The UBM 130 is covered with a thick layer of photoresist 140. The photoresist 140 is exposed and developed to create an opening 145 over a portion of the upper layer 136 of the UBM 130. An embodiment is shown in FIG. 1(d). The opening 145 in the photoresist 140 may be located directly over the bond pad 110. In another embodiment, the opening 145 may be offset to one side of the bond pad 110.

The UBM 130 serves as a low-resistance electrical path for electroplating a solder 150 from a plating solution through the opening 145 in the photoresist 140 over the exposed portion of the upper layer 136 of the UBM 130. The solder 150 may be formed from various compositions of Lead-Tin. Tin prevents oxidation and strengthens the bonding of the solder 150 to the UBM 130.

Once the thickness of the solder 150 being selectively deposited through the opening 145 in the photoresist 140 exceeds the thickness of the photoresist 140, the solder 150 will spread out in a mushroom shape. An embodiment is shown in FIG. 1(d). The thickness of the solder 150, or bump height, needs to be well-controlled, with a standard deviation of less than 2.5 microns (um) within the die and across the lot. The minimum distance between the centers of adjacent solder 150, or bump pitch, is usually limited by assembly and reliability considerations and is typically 100.0–250.0 microns (um).

After electroplating of the solder 150 is completed, the photoresist 140 is stripped off. Then, a wet etch solution is used to selectively etch the UBM 130 without etching the solder 150. Removal of the portions of the upper layer 136 and the lower layer 133 that are not covered by the solder 150 will electrically isolate the solder 150 from each other.

Figure 1E:
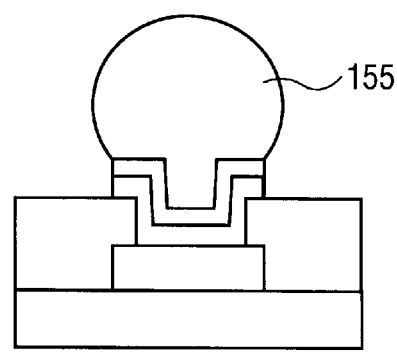

The next step is to reflow the solder 150 to form a bump 155. An embodiment is shown in FIG. 1(e). The melting temperature of the solder 150 depends on its composition. For example, a high Lead solder, such as 95 Pb/5 Sn by weight percent, flows at about 300–360 degrees Centigrade. Upon solidification, the solder draws into an approximately spherical shape due to surface tension.

A convection oven may be used to reflow the solder 150. The cover gas in the convection oven may include forming gas. Forming gas may have a passive component, such as 90.0% Nitrogen to prevent formation of oxides, and an active component, such as 10.0% Hydrogen to chemically reduce existing oxides.

Next, the die 100 is attached to the substrate 170. Solder paste 160 may be applied to a pad 172 of the substrate 170 in order to attach a bump 155 of the die 100. The solder paste 160 may include a solder alloy 165, a flux, a solvent, a surfactant, and an antioxidant. The solder alloy 165 is a combination of metals that melts or reflows at a certain temperature. The flux creates a wettable surface for the solder alloy 165 by removing oxides and other contaminants from the surface of the bump 155 of the die 100. The solvent prevents the flux from sublimating or polymerizing when the solder paste 160 is heated. The surfactant reduces the surface tension at the interface between the solder paste 160 and the bump 155 to further promote wetting of the solder alloy 165. The antioxidant prevents reoxidation of the surface of the bump 155 after the flux has prepared the surface of the bump 155 for soldering.

The solder paste 160 may be printed on the pad 172 of the substrate 170 with a stencil printer. A stencil is a metal foil that has laser-cut or chemically etched apertures that match the array of solder bumps 155 on the die 100. The stencil printer has two squeegees: one for a forward stroke and another for a reverse stroke. During printing, solder paste 160 is rolled in front of a squeegee to fill an aperture in the stencil. Then, the squeegee moves over the stencil and shears off the solder paste 160 in the aperture. The pressure generated by the squeegee injects the solder paste 160 into the aperture and onto the corresponding pad 172.

Figure 2A:
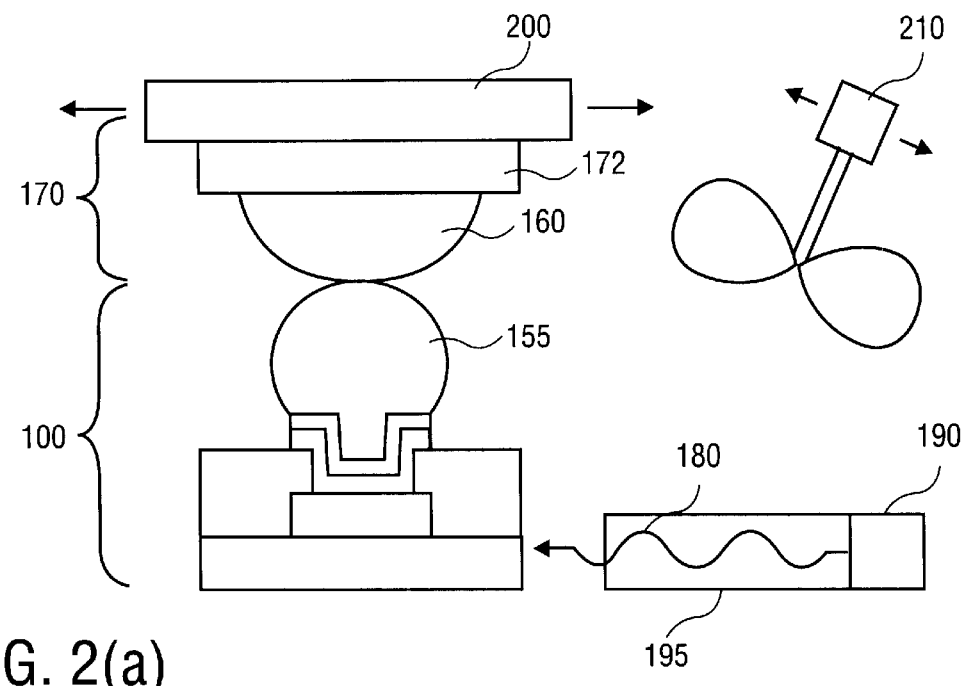
FIGS. 2(a)–(b) is an illustration of an elevation view of an embodiment of a method of forming a mechanical joint according to the present invention.

Next, the die 100 and the substrate 170 are aligned, placed in contact, and exposed to microwave energy 180. An embodiment is shown in FIG. 2(a). Microwave energy 180 refers to the portion of the electromagnetic spectrum from 1.0–40.0 GigaHertz (GHz). Microwave energy 180 may be generated from a magnetron 190. A magnetron 190 is a power tube oscillator that converts electrical power directly into Radio-Frequency (RF) power. A pulsed, low wattage power supply can generate about 1.0–1.5 kilowatt (kW) microwave power from a magnetron 190. A Continuous-Wave (CW), high wattage power supply can generate about 2.5–6.0 kW microwave power from a magnetron 190.

The microwave energy 180 from a magnetron 190 is transmitted through a waveguide 195 coupled to an input aperture towards the die 100 and the substrate 170 in a chamber of a batch tool or, alternatively, on a conveyor belt of an in-line tool. The walls around the chamber or conveyor belt are electrically conductive and define a resonant cavity with fixed dimensions. Emissivity of the walls may have a value such as 0.8. The cavity may be tuned to the proper resonant frequency and mode to maximize the amount of microwave energy 180 absorbed.

Whether an object absorbs or reflects microwave energy depends on the material and, to a lesser extent, its shape and size. For example, Silicon and Carbon absorb microwave energy 180 and are heated up readily. In contrast, metals reflect microwave energy 180 and are not heated up directly.

Good thermal management requires that the microwave energy 180 within a large volume be well-mixed. In one embodiment, the frequency of the microwave energy 180 can be varied very rapidly. Sweeping of the frequency prevents standing waves and eliminates arcing damage due to build-up of charges in metal or Silicon on the die 100. Variable-frequency microwave energy 180 may be provided in a tool such as a MicroCure 2100 (batch) or 5100 (in-line) system manufactured by Lambda Technologies, Inc., of Morrisville, N.C. The microwave energy 180 may be set at 5.8 (+/−1.12) GHz with a power output of about 400.0–750.0 Watts.

In another embodiment, a susceptor 200, capable of linear motion and rotational motion, is used to hold the substrate 170 and further mix the microwave energy 180. The susceptor 200 is formed of a material that does not absorb microwave energy 180.

In still another embodiment, a stirrer 210, capable of linear and rotational motion, is used to further mix the microwave energy 180. The stirrer 210 is formed of a material that reflects microwave energy 180.

In one embodiment, the process includes a ramp up rate of about 28.0 degrees Centigrade per second to a peak temperature of about 221.0–240.0 degrees Centigrade with a dwell time of 15.0–30.0 seconds at the peak temperature, followed by an unaided cool down to 100.0 degrees Centigrade. Reflow may be performed in an inert atmosphere, such as Nitrogen with a purity level of 10.0–25.0 parts per million (ppm).

Figure 2B:
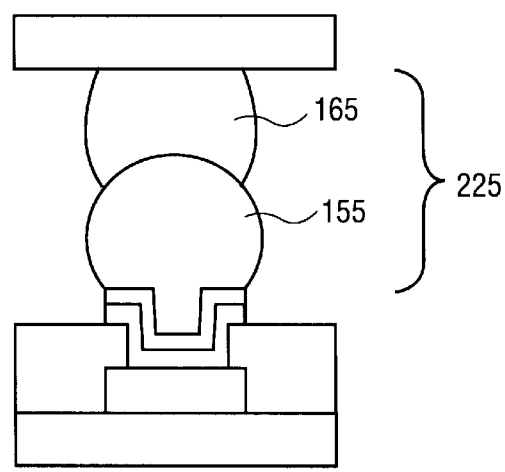

The variable-frequency microwave energy 180 radiation is absorbed by the Silicon material in the die 100, transformed into heat by molecular excitation, and conducted through the die bump 155 to indirectly heat the solder paste 160 on the pad 172 of the substrate 170. The heat activates the flux in the solder paste 160 to remove metal oxides from the surface of the bump 155 on the die 100 to improve adhesion of the solder alloy 165. The heat also melts the solder alloy 165 in the solder paste 160. Surface tension causes the solder alloy 165 to wet and self-align to the bump 155 on the die 100 and, upon solidification, to form a mechanical joint 225 between the bump 155 on the die 100 and the corresponding pad 172 on the substrate 170. An embodiment of a mechanical joint 225 of the present invention is shown in FIG. 2(*b*).

Variable-frequency microwave energy 180 allows the desired temperature to be achieved quickly and uniformly so as to reflow the solder alloy 165 without unnecessarily heating up other portions of the substrate 170 assembly and package. The selective heating reduces stress in the substrate 170 assembly and package while allowing fast temperature ramps. In addition to reflowing solder alloy 165 in a significantly shorter time, the variable frequency microwave energy 180 also offers a wider thermal margin between the die 100 and the substrate 170. This reduces the stresses on the bump 155 caused by mismatch in Coefficient of Thermal Expansion (CTE). In addition, this allows the usage of a substrate with the bottom side pre-pinned with similar solder paste as the top side. Otherwise, the chip join process will result in unacceptable True Position Radius (TPR) of the pins or unacceptable pin pull strength.

The solder alloy 165 may be an eutectic solder, such as 37 Pb/63 Sn by weight percent, that reflows at about 180–240 degrees Centigrade. Alternatively, "no-lead" solder, which is more environmentally friendly, may be printed on the substrate 170. For example, a binary alloy of 96.5 Sn/3.5 Ag by weight percent that flows at about 230 degrees Centigrade may be used. A ternary alloy of 95.5 Sn/4.0 Cu/0.5 Ag by weight percent that flows at about 215 degrees Centigrade may also be used.

Figure 3:
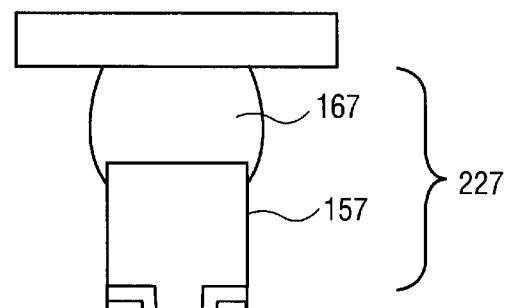
FIG. 3 is an illustration of an elevation view of an embodiment of a mechanical joint between a solder over a substrate and an Alternate Ball Metallurgy (ABM) over a die according to the present invention.

In another embodiment, Alternate Ball metallurgy (ABM) 157, rather than Lead-Tin solder 150, is electroplated from solution onto the UBM 130 of the die 100. In one embodiment, the ABM 157 is Copper that is electroplated with a column or pillar shape onto the UBM 130. In the embodiment using ABM 157, reflow is not done for the ABM 157 so the columnar or pillar shape is preserved. FIG. 3 shows an embodiment of a mechanical joint 227 of the present invention resulting from reflow of solder alloy 165 on a pad 172 of a substrate 170 to attach the ABM 157 of the die 100.

After reflow is completed, residue around the bump 155 or ABM 157 may be removed by deflux, such as with Deionized (DI) water. Next, underfill may be dispensed between the die 100 and the substrate 170 and cured to reduce stress on the mechanical joint 225 or 227. Then ashing may be done, followed by dispensing of epoxy and attachment of a thermal spreader or heat sink.

Other embodiments, besides electroplating, may be used to form a bump of the die 100. Examples include solder stencil printing, solder screen printing, stud bumping, evaporation through a Molybdenum shadow mask (Controlled Collapse Chip Connection or C4), sputtering, electroless bumping, solder jetting, and polymer bumping.

Other embodiments, besides stencil printing, may also be used to form the solder on the pad 172 of the substrate 170. Examples of flux transfer include pin transfer, screen printing, and direct dipping. Examples of solder ball transfer include gravity-with-stencil and vacuum-and-pick-and-place.

Many alternative embodiments and numerous particular details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of selectively reflowing solder to form a mechanical joint between a substrate and a die.

We claim:

1. A method comprising:

forming a solder over a substrate;

placing said solder in contact with an input/output connection of a die;

heating said substrate and said die with variable-frequency microwave energy transmitted through a waveguide to reflow said solder; and forming a mechanical joint between said substrate and said die.

2. The method of claim 1 wherein frequency of said microwave energy is swept very rapidly.

3. The method of claim 1 further comprising mixing said microwave energy by moving said substrate and said die during said heating.

4. The method of claim 1 further comprising mixing said microwave energy by stirring with a reflective material.

5. The method of claim 1 further comprising activating flux prior to said reflowing of said solder.

6. The method of claim 1 wherein said input/output connection is a bump.

7. The method of claim 6 wherein said solder comprises an eutectic solder and said bump comprises a high Lead solder.

8. The method of claim 6 wherein said solder comprises a no-Lead solder and said bump comprises Alternate Ball Metallurgy (ABM).

9. A method comprising:

forming a final passivation layer over a die;

removing said final passivation layer over a bond pad of said die;

forming an Under Bump Metallurgy (UBM) over said bond pad and said passivation layer;

forming a photoresist over said UBM;

uncovering a first portion of said UBM by selectively removing said photoresist, said first portion disposed over said bond pad;

covering said first portion of said UBM by selectively forming a first solder;

removing rest of said photoresist;

removing a second portion of said UBM, said second portion not covered by said first solder;

reflowing said first solder into a bump;

placing said bump in contact with a second solder on a substrate; and reflowing said second solder with variable-frequency microwave energy transmitted through a waveguide.

10. The method of claim 9 wherein frequency of said microwave energy is swept very rapidly.

11. The method of claim 9 wherein said reflowing of said first solder into said bump is with microwave energy.

12. The method of claim 11 wherein said microwave energy has variable frequency.

13. The method of claim 9 wherein said reflowing of said second solder is at a temperature that is about 50 degrees Centigrade lower than said reflowing of said first solder.

* * * * *